(12) United States Patent
Lien et al.

(10) Patent No.: US 10,541,034 B2
(45) Date of Patent: Jan. 21, 2020

(54) DETERMINING READ VOLTAGES FOR A STORAGE DEVICE

(71) Applicant: Seagate Technology LLC, Cupertino, CA (US)

(72) Inventors: Nicholas Odin Lien, Shakopee, MN (US); Ryan James Goss, Shakopee, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/966,650

(22) Filed: Apr. 30, 2018

(65) Prior Publication Data
US 2019/0051360 A1 Feb. 14, 2019

Related U.S. Application Data

(63) Continuation of application No. 15/675,992, filed on Aug. 14, 2017, now Pat. No. 9,966,147.

(51) Int. Cl.
| | |
|---|---|
| *G11C 16/26* | (2006.01) |
| *G11C 16/04* | (2006.01) |
| *G11C 11/16* | (2006.01) |
| *G11C 29/42* | (2006.01) |

(52) U.S. Cl.
CPC .......... *G11C 16/26* (2013.01); *G11C 11/1673* (2013.01); *G11C 16/0408* (2013.01); *G11C 29/42* (2013.01)

(58) Field of Classification Search
CPC . G11C 16/26; G11C 16/0408; G11C 11/1673; G11C 29/42

USPC ..................................................... 365/189.15
See application file for complete search history.

(56) References Cited

U.S. PATENT DOCUMENTS

| | | | |
|---|---|---|---|
| 10,089,373 B1 * | 10/2018 | Allen | G06F 16/27 |
| 2011/0066902 A1 | 3/2011 | Sharon et al. | |
| 2013/0163328 A1 | 6/2013 | Karakulak et al. | |
| 2014/0071761 A1 * | 3/2014 | Sharon | G11C 16/26 365/185.18 |
| 2015/0194983 A1 | 7/2015 | Varanasi et al. | |
| 2015/0205664 A1 | 7/2015 | Janik et al. | |
| 2015/0364202 A1 | 12/2015 | Karakulak et al. | |
| 2016/0148702 A1 | 5/2016 | Karakulak et al. | |
| 2016/0197623 A1 * | 7/2016 | Varanasi | G11C 11/5621 714/764 |
| 2016/0372209 A1 * | 12/2016 | Matsunaga | G11C 16/3404 |
| 2017/0097868 A1 * | 4/2017 | Kim | G06F 11/1068 |
| 2019/0044538 A1 * | 2/2019 | Palangappa | H03M 13/1125 |

* cited by examiner

*Primary Examiner* — Fernando Hidalgo
(74) *Attorney, Agent, or Firm* — Taylor English Duma LLP

(57) ABSTRACT

Systems and methods presented herein provide for computing read voltages for a storage device. In one embodiment, a controller is controller is operable to soft read data from a portion of the storage device, and to iteratively test the soft read data a predetermined number of times. For example, the controller may test the soft read data a number of times by applying a different probability weight to the soft read data each time the soft read data is tested. The controller may then decode the soft read data based on the probability weight, and determine an error metric of the decoded soft read data. Then, the controller determines a read voltage for the portion of the storage device based on the probability weight and the error metric.

18 Claims, 6 Drawing Sheets

DETERMINING READ VOLTAGES FOR A STORAGE DEVICE

CROSS REFERENCE TO RELATED APPLICATIONS

This patent application is a continuation patent application claiming priority to, and thus the benefit of an earlier filing date from, U.S. patent application Ser. No. 15/675,992 (filed Aug. 14, 2017), the contents of which are incorporated by reference.

SUMMARY

Systems and methods presented herein provide for computing read voltages for a storage device. In one embodiment, a controller is operable to soft read data from a portion of the storage device, and to iteratively test the soft read data a predetermined number of times. For example, the controller may apply a different probability weight, such as a log likelihood ratio (LLR) weight, to the soft read data each time the soft read data is tested. The controller may then decode the soft read data based on the probability weight, and determine an error metric of the decoded soft read data. Then, the controller determines a read voltage for the portion of the storage device based on the probability weight and the error metric.

The various embodiments disclosed herein may be implemented in a variety of ways as a matter of design choice. For example, the system and method embodiments hereof may take the form of computer hardware, software, firmware, or combinations thereof. Other exemplary embodiments are described below.

BRIEF DESCRIPTION OF THE FIGURES

Some embodiments are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments. It will thus be appreciated that those skilled in the art will be able to devise various arrangements that, although not explicitly described or shown herein, embody the principles of the embodiments and are included within the scope of the embodiments. Furthermore, any examples described herein are intended to aid in understanding the principles of the embodiments and are to be construed as being without limitation to such specifically recited examples and conditions. As a result, the embodiments are not limited to any specific examples described below.

Figure 1:
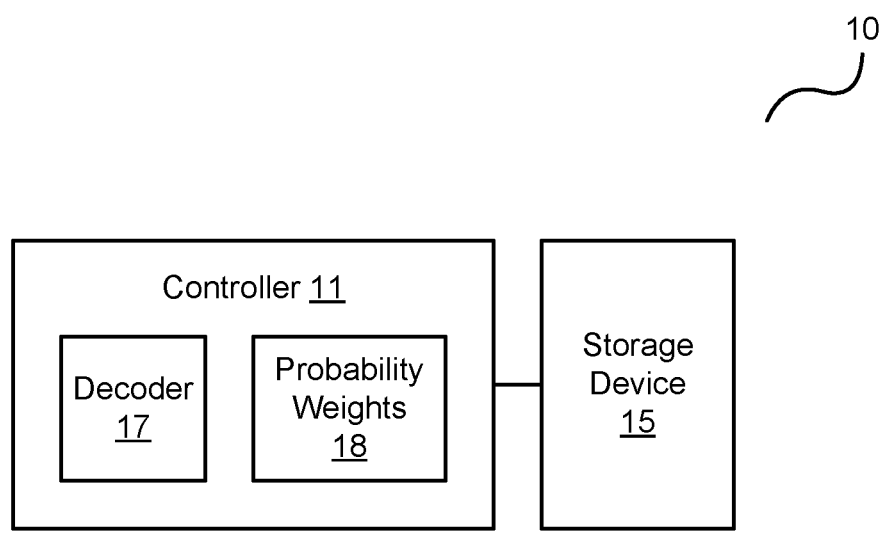
FIG. 1 is a block diagram of an exemplary storage system for determining read voltages for a storage device.

FIG. 1 is a block diagram of an exemplary storage system 10 for determining read voltages of a storage device 15. For example, in semiconductor based storage systems, data is "hard read" with a read threshold voltage being applied to memory cells of a storage device. The hard read data is subject to errors due to, for example, age of the memory cells, ambient temperature, etc. The read threshold voltage applied to the memory cells, however, may be adjusted to compensate for these issues. In this regard, a controller 11 of the storage system 10 is operable to "soft read" data from the storage device 15 and determine subsequent hard read threshold voltages for memory cells of the storage device 15 based on the soft read data.

Generally, soft read data is used in semiconductor based storage systems (and other types of storage such as magnetic recording media) to improve error correction and/or performance. For example, hard read data may be corrected using error correction coding (ECC). To reduce the amount of ECC used, the data may also be soft read a number of times using a plurality of sequentially increasing read voltages. The soft read data is generally a redundant form of the hard read data and may be used to indicate a reliability of the hard read data. In a flash memory device, a soft read bit may be used to indicate reliability of a hard read bit (e.g., via a hard read voltage).

Probability weights, such as LLR weights, may be calculated for the soft reads, and the soft read data is decoded via a low density parity check (LDCP) decoder. Then, the decoded soft read data may indicate which bits of data are likely to be "incorrect" such that they can be flipped prior to error correction.

While the soft read data can be used to improve error correction, the controller 11 can also use the soft read data to select/determine read threshold voltages for subsequent hard reads. For example, the controller 11 may perform a single soft read of data and use pre-calculated probability weights 18 on the soft read data to predict a read threshold voltage for a subsequent hard read after the soft read data is decoded by a decoder 17. An example of this process is illustrated in FIG. 2.

Based on the foregoing, the controller 11 is any device, system, software, firmware, or combination thereof operable to soft read data from the storage device 15 and to determine hard read threshold voltages of the storage device 15 based on the soft read data. The controller 11 may also be operable to write data to the storage device 15, and perform various other operations on the storage device 15 (e.g., command suspensions, background scans, garbage collection, error correction encoding/decoding of data on the storage device 15, etc.). The storage device 15 is any device capable of storing data, persistent or otherwise, in which read threshold voltages may be adjusted. Examples of the storage device 15 include magnetoresistive random-access memory devices, magnetic disks, Random Access Memories (RAMs, such as DRAMs), magnetic recording media, or various combinations thereof. Accordingly, the controller 11 is operable to perform the processes disclosed herein on any variety of storage devices.

Figure 2:
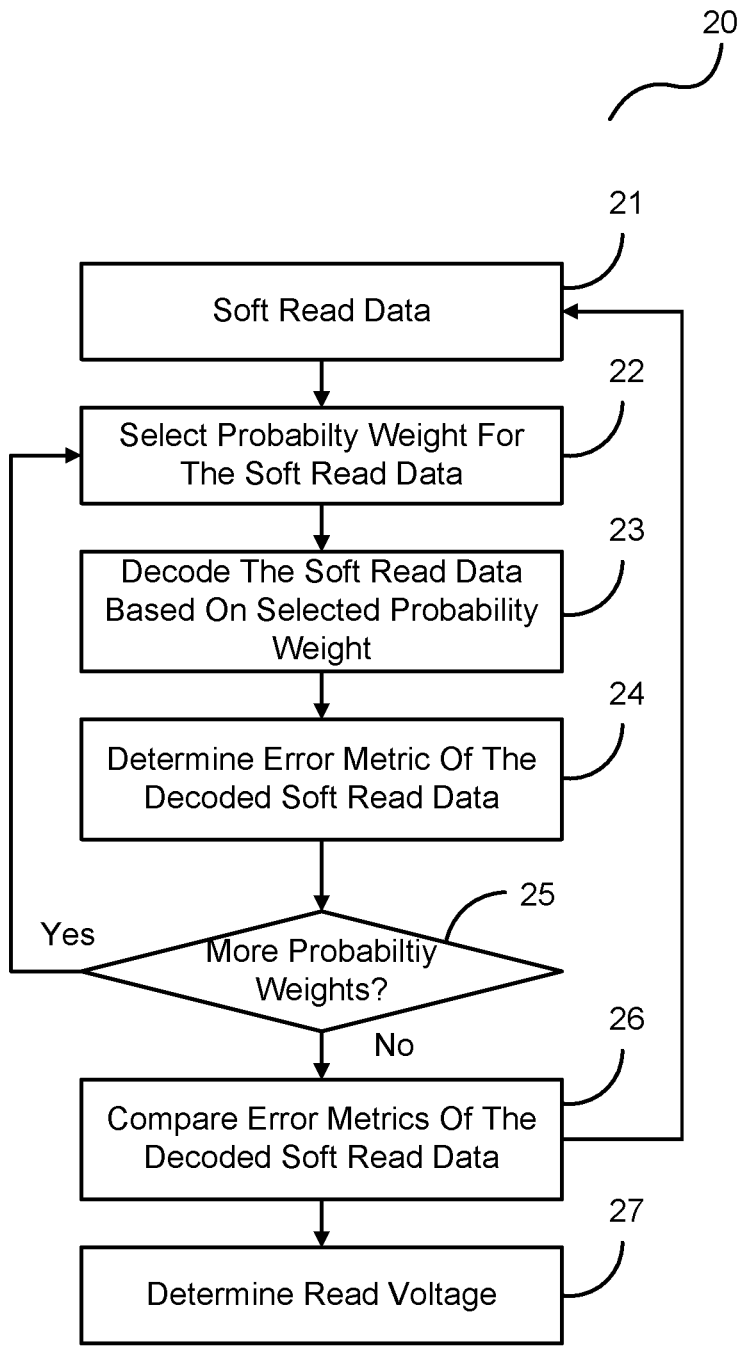
FIG. 2 is a flowchart of an exemplary process of the storage system of FIG. 1.

FIG. 2 is a flowchart of an exemplary process 20 of the storage system 10. The process 20 initiates with the controller 11 soft reading a portion of the storage device 15, in the process element 21. For example, in a NAND flash memory device embodiment, the controller 11 may soft read a page of memory cells from the storage device 15 by applying a voltage to the memory cells.

The controller 11 may then begin iteratively testing the soft read data using a number of pre-calculated weights 18. In doing so, the controller 11 may select an initial probability weight for the soft read data, in the process element 22. The controller may then decode the soft read data based on that selected probability weight using the decoder 17 (e.g., an LDPC decoder), in the process element 23. The controller 11 may then determine an error metric of the decoded soft read data, such as a number of LDPC iterations it took to make the data converge to the corrected hard read data, in the process element 24. For example, the controller 11 may compare the soft read data to an error corrected version of the hard read data to determine how many errors there are in the soft read data. Then, based on the based on the probability of the soft read data being correct, the controller 11 may determine the error metric of the soft read data.

If there are additional probability weights 18 to use on the soft read data, then the controller 11 returns to the process element 22 and selects another probability weight to continue testing of the soft read data. Once the desired number of probability weights has been exhausted, the controller 11 compares the error metrics of the decoded soft read data, in the process element 26, and determines a read voltage for a subsequent hard read, in the process element 27.

In other words, different decode attempts can use different probability weights 18 to apply different amounts of likelihood to individual read voltages to predict which read threshold voltage is more likely to be correct. Statistical observations of these decodes over time can give hints to suggest that a read threshold voltage calibration is needed, and in which direction it should move.

Figure 3A:
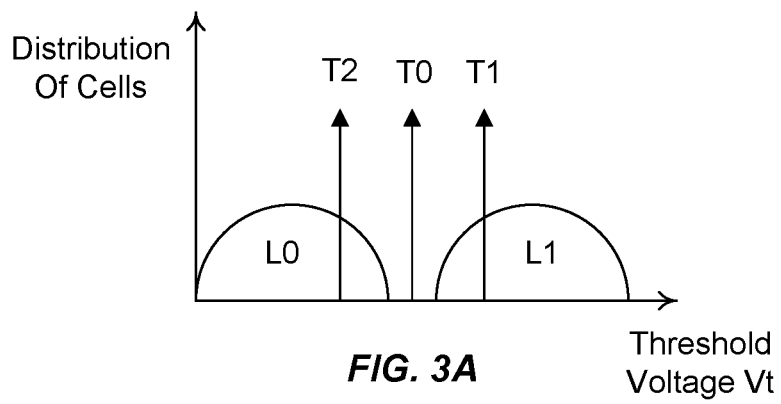
FIGS. 3A-3C illustrate exemplary read voltages of the storage device.
Figure 3B:
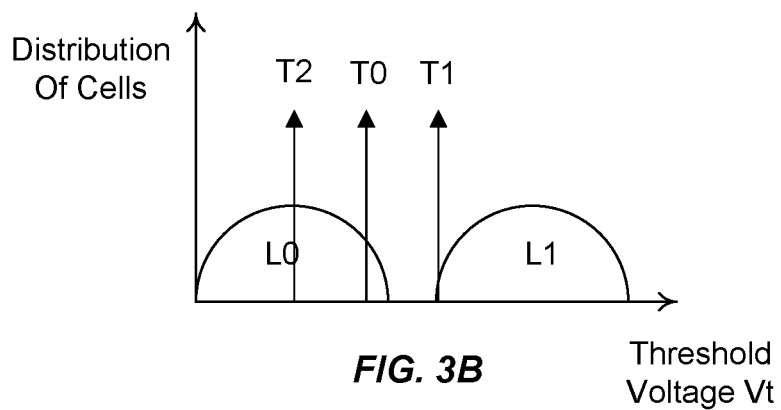
Figure 3C:
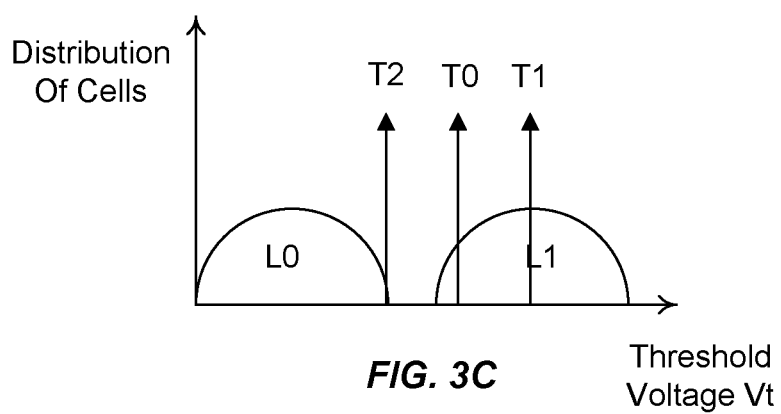

To illustrate, FIGS. 3A-3C show exemplary read voltages T0, T1, and T2 (T being the ideal read threshold voltage) of the storage device 15. In this embodiment, three different voltages are used to soft read the data of a portion of the storage device 15. Then, LLR weights may be applied to the three soft read voltages to be decoded by the decoder 17. The controller 11 then determines the error metrics of the three soft reads based on the LLR weights. Then, the best error metric may determine how the threshold voltage should be adjusted.

The exemplary table below corresponds to FIGS. 3A-3C.

| | LLR Weights for 3-Read Soft LDPC | | | | |
|---|---|---|---|---|---|
| Decode | Vt < T2 | T2 < Vt < T0 | T0 < Vt < T1 | Vt > T1 | Read Voltage Vt Action |
| 0 | −7 | −2 | 2 | 7 | Maintain Vt |
| 1 | −5 | −1 | 2 | 7 | Increase Vt |
| 2 | −7 | −2 | 1 | 5 | Decrease Vt |

The LLR weights of the decode step 0 represent the ideal voltage of the read threshold voltage T0. Thus, after the soft read that is decoded with these LLR weights, the controller 11 determines that no change is needed in the read threshold voltage T0, as illustrated in FIG. 3A. However, if the controller 11 determines that the LLR weights of the decode step 1 produce the best error metric, as illustrated in FIG. 3B, the controller 11 determines that the read threshold voltage needs to be increased. And, after the using the LLR weights of the decode step 2, the controller 11 determines that the read threshold voltage needs to be decreased, as illustrated in FIG. 3C. Generally, the above table relates to a hardware implementation. However, in a software embodiment, the LLR weights may be represented as percentages.

Figure 4:
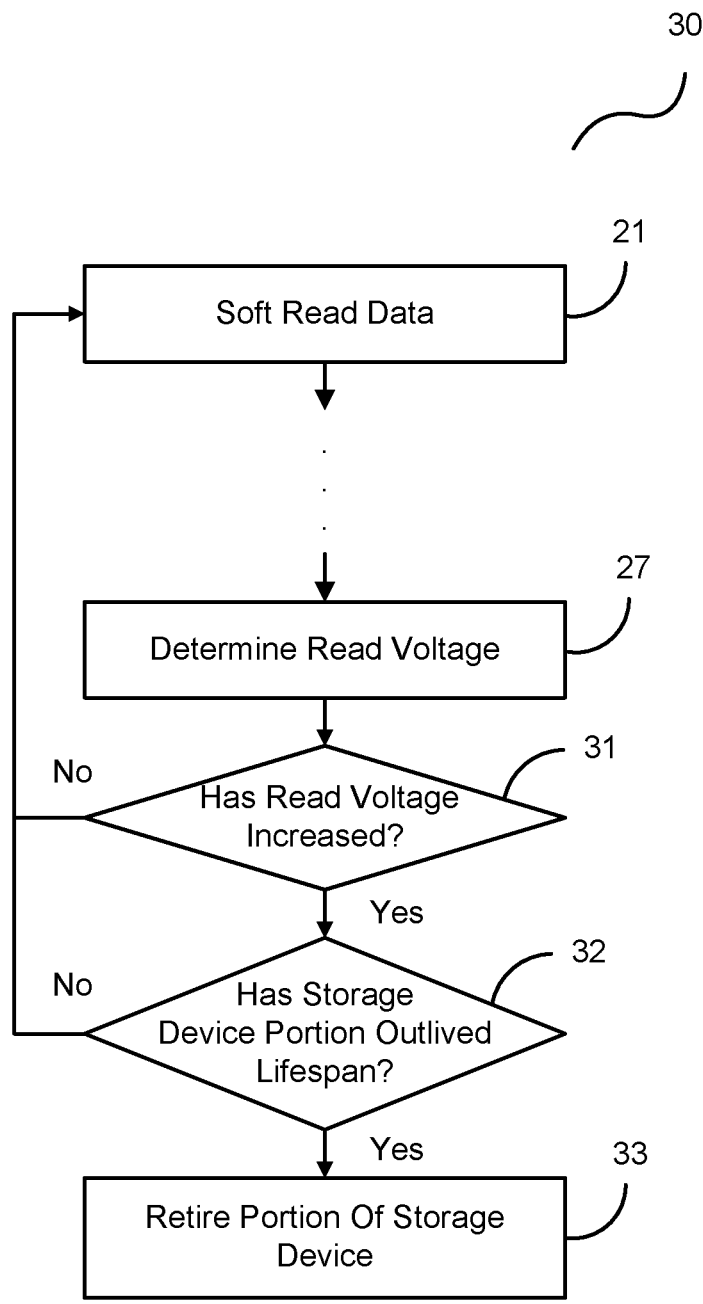
FIG. 4 is a flowchart of another exemplary process of the storage system of FIG.

FIG. 4 is a flowchart of another exemplary process 30 of the storage system 10. In this embodiment, the process 30 works in conjunction with the process 20 of FIG. 2. For example, after the controller 11 performs the soft read of the data of the storage device 15, in the process element 21 and ultimately determines the read voltage, in the process element 27, the controller 11 may retain historical information about the read voltages being applied to the portions of storage device 15. In this regard, the controller 11 may determine whether the read voltage has increased over time, in the process element 31.

If the controller 11 determines that the read threshold voltage has not increased, the controller 11 may return to the process element 21 to again soft read the data at some later point in time. For example, based on a priori information of the storage device 15 (e.g., age of the storage device 15, wear of the particular portion of the storage device 15, change in ambient temperature, etc.), the controller 11 may determine that another soft read of the data is needed to determine whether a change to a subsequent read threshold voltage is necessary.

If, however, the controller 11 determines that the read threshold voltage has increased, the controller 11 may determine whether the portion of the storage device 15 has outlived its lifespan, in the process element 32. For example, if a portion of the storage device 15, such as a page or a block of a NAND flash device, has reached its life expectancy, then that portion of the storage device 15 may start delivering more errors regardless of the read threshold voltage. So, once the read threshold voltage reaches a known maximum for the storage device 15, the controller 11 may determine that that portion of the storage device 15 has outlived its usefulness. Thus, the controller 11 may then retire that portion of the storage device 15, in the process element 33. Otherwise, the controller 11 may continue monitoring the portion of the storage device 15 by returning to the process element 21.

Alternatively, the controller 11 may place the portion of the storage device 15 in suspension to continue testing that portion of the storage device 15. For example, the controller 11 may continue testing that portion of the storage device 15 to determine whether errors originating from there are transient in nature. If the controller 11 determines that the errors are indeed transient, the controller may return that portion of the storage device 15 to service after testing.

This historical information about the read threshold voltages can also be useful in determining other subsequent read threshold voltages based on the probability weights 18. For example, significant use of a portion of the storage device 15 may wear that portion of the storage device 15 over time and increase the read errors therefrom. Thus, the controller 11 will adjust the read threshold voltage to decrease those errors. But, when a subsequent adjustment to the read threshold voltage is needed, the controller 11 may need to choose another set of probability weights 18. Thus, tracking increases of the read threshold voltages may allow the controller 11 to properly select subsequent pre-calculated probability weights 18 for other subsequent read threshold voltage adjustments.

To illustrate, the controller 11 may apply the probability weights 18 as described hereinabove to determine a subsequent read threshold voltage. Then, the controller 11 may use that subsequent read threshold voltage to select another set of probability weights 18 to compute yet another subsequent read threshold voltage, and so on.

Advantages of the embodiments disclosed herein include improved performance due to the amount of time needed to compute subsequent read threshold voltages. For example, some storage systems may soft read a portion of the storage device multiple times with multiple sets of read voltages and then compute probability weights for each of those reads to determine which of them produces the fewest errors. While soft reading is a relatively quick process (e.g., 30 µs-100 µs to transfer 32 kB at 200-800 Mbits per second), multiple soft reads can significantly increase the amount of time of the LDPC decoding. And, this does not even take into consideration how a subsequent read threshold voltage would be chosen or how long it would take to choose such. The embodiments herein provide for a single soft read and calibration of the read threshold voltage based on that soft read which is generally on the order of a few nanoseconds due to the speed of the decoder 17. Using pre-calculated probability weights also lessens the amount of time needed by the controller 11 to determine a subsequent read threshold voltage, as such is generally on the order of a few nanoseconds.

Again, the embodiments disclosed herein may be useful in a variety of storage devices, including non-volatile NAND flash devices, other semiconductor based storage devices, and even magnetic recording media. In one embodiment, the storage device 15 is a non-volatile NAND flash device configured using one or more SSD architectures, such as Single Level Cell (SLC) architectures and Multi-Level Cell (MLC) architectures. An SLC architecture allows a memory cell to store one bit of data. Traditionally, an MLC architecture meant that a memory cell could store two bits of data. But, architectures have evolved and now provide even higher levels of density, such as Triple Level Cell (TLC) architectures that store three bits per memory cell, and Quad Level Cell (QLC) architectures that store four bits per memory cell. Generally, though, any architecture storing more than one bit of data per cell may also be referred to as an MLC architecture.

Typically, each memory cell of a flash device is configured like a Metal Oxide Semiconductor Field Effect Transistor (MOSFET) with a control gate. But, each memory cell also has a floating gate surrounded by an insulating oxide layer configured between the control gate and the channel of the MOSFET. Because the floating gate is electrically isolated by its insulating layer, electrons placed on it are trapped until they are removed by an application of an electric field (e.g., an applied voltage). Placing electrons on the floating gate sets the transistor to the logical "0" state. Once the floating gate is charged, the electrons in it screen the electric field from the control gate, thereby increasing the threshold voltage of the memory cell. This means that a higher voltage is applied to the control gate to make the channel of the transistor conductive.

In order to write a value from the transistor, an intermediate voltage between the threshold voltages is applied to the control gate. If the channel conducts at this intermediate voltage, the floating gate is uncharged and causes a logical "1" to be stored in the memory cell. If the channel does not conduct at the intermediate voltage, it indicates that the floating gate is charged causing a logical "0" to be stored in the memory cell. The presence of a logical "0" or a logical "1" is sensed by determining whether there is current flowing through the transistor when the intermediate voltage is asserted on the control gate.

It should be noted that the embodiments herein are not intended be limited to the examples shown herein. Additionally, the processes described herein are also merely exemplary in nature and are not intended to be limited to the number or order of the process elements of those embodiments.

Figure 5:
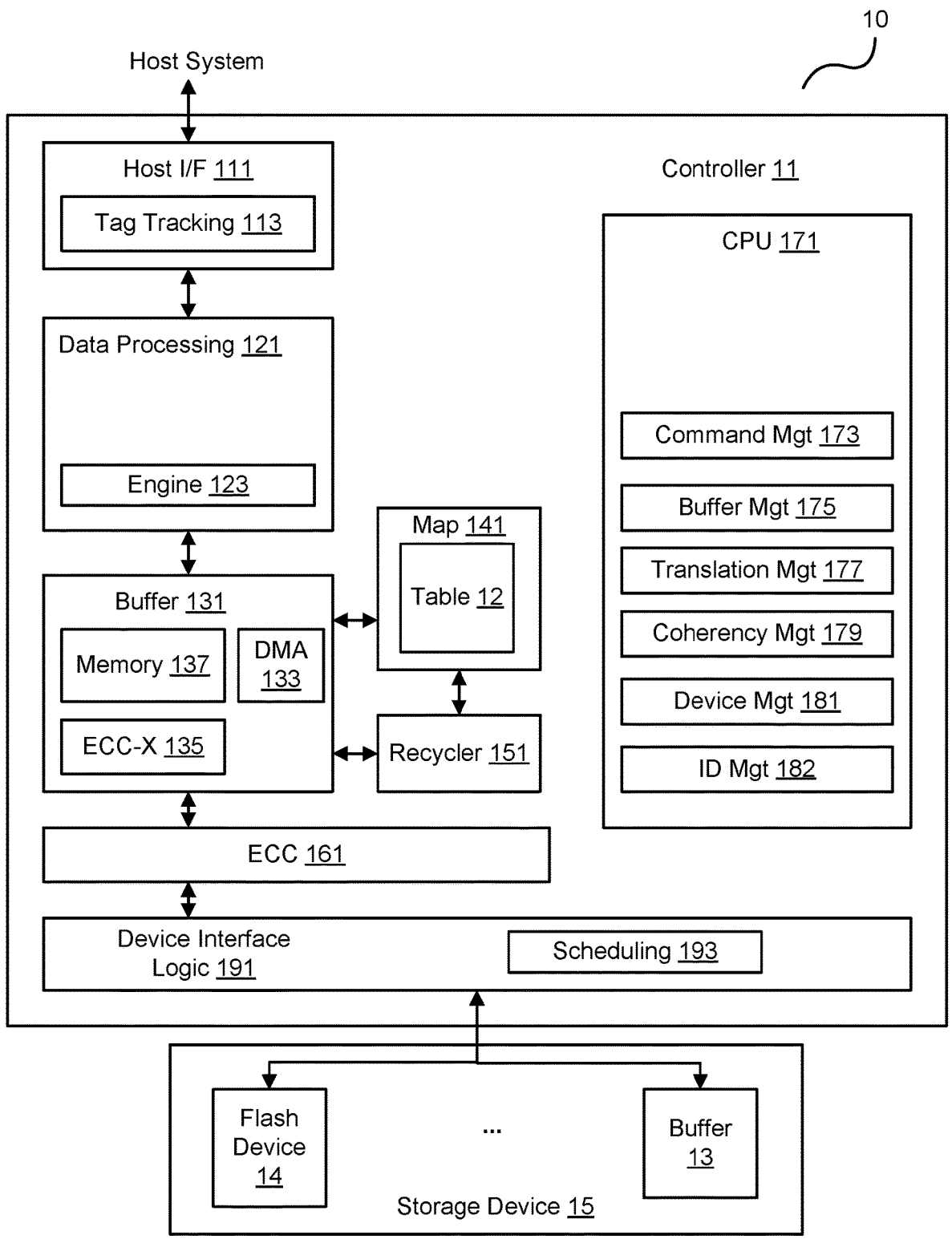
FIG. 5 is a block diagram of an exemplary storage controller and its associated storage device.
Figure 6:
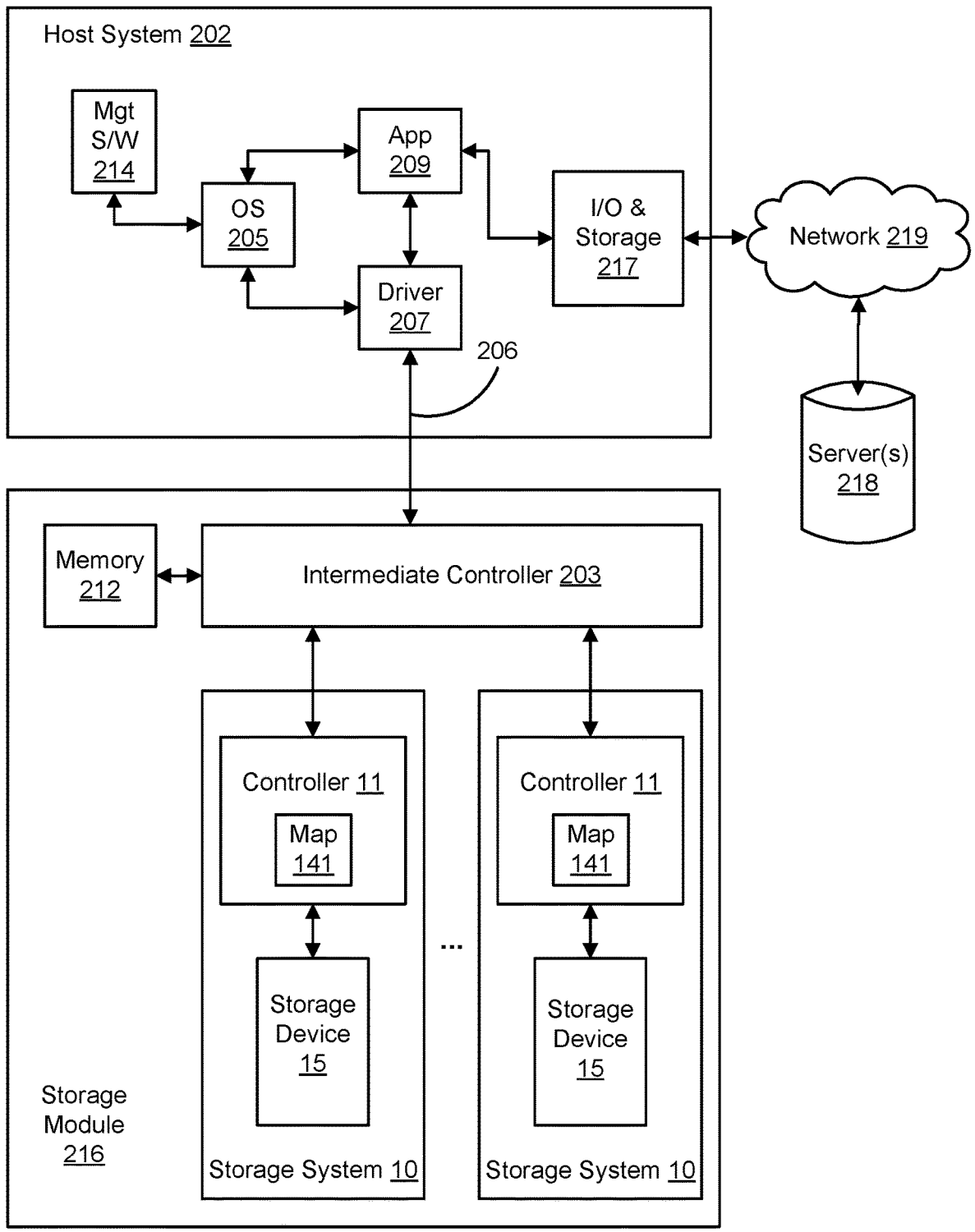
FIG. 6 is a block diagram of an I/O module comprising storage devices and their associated controllers interfacing with a host system.

Furthermore, the embodiments herein can take the form of hardware, firmware, software, or a combination thereof. For example, FIGS. 5 and 6 illustrate such a combination that may be operable to employ the systems and methods described herein. More specifically, FIG. 5 is a block diagram of an exemplary storage system 10 and its associated device controller (e.g., the controller 11) and storage device 15 (e.g., comprising flash devices 14). FIG. 8 is a block diagram of a storage module 216 comprising storage systems 10 and their associated controllers 11/storage devices 15 interfacing with a host system 502.

In FIG. 5, the controller 11 includes a host interface 111 that is operable to interface with a host system to communicate I/O operations of the host system. The host interface 111 may be configured with a tag tracking module 113 that is operable to track progress of individual I/O commands (e.g., read and write commands to certain addresses in the storage device 15). The tag tracking module 113 may associate an external flag of a command received from the host system with an internal flag that the controller 11 can access during processing of the command to identify the status of the processing.

The controller 11 also includes a data processing module 121 that comprises a processing engine 123 generally operable to perform certain tasks on data that is received from the host interface 111 or residing within a buffer 131, such as one or more of formatting the data, transcoding the data, compressing the data, decompressing the data, encrypting the data, decrypting the data, data encoding/formatting, or any combination thereof. For example, a processing engine 123 of the data processing module 121 may be operable to process the I/O operation from an I/O module of the host system generating the operation, such that the data of the I/O operation may be written to the logical address of the storage device 15. The processing engine 123 may extract the data of the write I/O command and prepare it for storage in the storage device 15. In doing so, the processing engine 123 may compress the data using any of a variety of data compression algorithms. When retrieving the data from the storage device 15, the processing engine 123 may decompress the data according to the algorithm used to compress the data for storage.

The buffer 131 is operable to store data transferred to and from the host system. The buffer 131 may also store system data, such as memory tables used by the controller 11 to manage the flash device 14, the buffer 13, and any possible higher-level RAID functionality in the memory 137. Other modules may include an error correcting code (ECC-X) module 135 to provide higher-level error correction and redundancy functionality, and a Direct Memory Access (DMA) module 133 to control movement of data to and from the buffer 131.

The controller 11 also includes an error correction code module 161 operable to provide lower level error correction and redundancy processing of the data in the buffer 131 using any of a variety of error correction codes techniques (e.g., cyclic redundancy checks, Hamming codes, low-density parity check coders, etc.).

A device interface logic module 191 is operable to transfer data to and from the storage device 15 according to the protocol of the devices therein. The device interface logic module 191 includes a scheduling module 193 that is operable to queue I/O operations to the storage device 15.

The controller 11 herein also includes a map module 141 that is operable to perform data addressing to locations in the storage device 15 according to the lookup table 12. For example, the map module 141 may use the lookup table 12 to convert logical block addresses (LBAs) from the host system to block/page addresses directed to the buffer 13, the flash device 14, or both. The lookup table 12 may be stored in whole or in part in controller 11 and/or in storage device 15. For example, in some embodiments a portion of the lookup table 12 may be cached in the controller 11 with generally all of lookup table 12 being stored non-volatilely in the storage device 15.

A recycler 151 performs garbage collection on behalf of the controller 11. For example, the recycler 151 may determine portions of the storage device 15 that are actively in use by scanning the lookup table 12 of the map module 141. In this regard, the recycler 151 may make unused, or "deallocated", portions of the storage device 15 available for writing by erasing the unused portions. The recycler 151 may also move data within the storage device 15 to make larger contiguous portions of the storage device 15 available for writing.

The controller 11 also includes a CPU 171 that controls various aspects of the controller 11. For example, the CPU 171 may process instructions or firmware to implement command management 173 that tracks and controls commands received from the host system. This firmware may also implement buffer management 175 that controls allocation and use of the buffer 131 and translation management 177 or to control the map module 141. The firmware may also employ coherency management 179 to control consistency of data addressing to avoid conflicts such as those that may occur between external data accesses and recycled data accesses. The firmware may also provide device management 181 to control the device interface logic module 191 and identity management 182 to control modification and communication of identity information of components within the controller 11.

In FIG. 6, the host system 202 is operable to process software instructions and perform I/O operations with the storage module 216 to read from and write to one or more storage systems 10. In this regard, the host system 202 may include an operating system 205 that provides the computing environment for the host system 202. A driver 207 is operable to communicate through the link 206 to the storage module 216 to perform the I/O operations with the various storage systems 10 configured therewith.

Like other computing systems, the operating system 205 may be initiated via management software 214 (e.g., Bios software). The host system 202 may also include application software 209 to perform various computing processes on behalf of the host system 202 (e.g., word processing applications, image processing applications, etc.). The host system 202 may also include I/O and storage functionality 217 operable to conduct I/O operations with one or more servers 218 through a communication network 219 (e.g., the Internet, local area networks, wide-area networks, etc.). In this regard, the storage module 216 may act as a cache memory of I/O operations for the host system 202.

The storage module 216 may be configured with an intermediate controller 203 that is operable to switch various I/O operations of the host system 202 to LBAs of the storage systems 10. In this regard, the storage module 216 may include a memory 212 that stores mapping information for the intermediate controller 203 to conduct the I/O operations to the LBAs. The map module 141 of the controller 11 may also be operable to perform data addressing with variable-sized mapping units to locations in the storage device 15 according to the lookup table 12, and convert LBAs from the host system 202 to block/page addresses directed to the storage device 15.

What is claimed is:

1. A storage system, comprising:
   a storage device; and
   a controller operable to soft read data from a portion of the storage device, the portion being less than the entire storage device, to decode the soft read data a plurality of times using a plurality of probability weights, to compare each decoded soft read data to hard read data from the portion of the storage device, to generate a plurality of error metrics based on the comparisons, to establish a read voltage for a subsequent hard read of the portion of the storage device based on the error metrics, to track historical increases in the established read voltage, to determine a lifespan of the portion of the storage device based on the historical increases in the established read voltage, and to retire the portion of the storage device when the established read voltage increases past a known voltage and the portion of the storage device has passed its lifespan.

2. The storage system of claim 1, wherein:
   the controller is further operable to decode the soft read data using a low density parity check (LDPC).

3. The storage system of claim 1, wherein:
   the storage device is a NAND flash memory device, a magnetoresistive random-access memory device, or a combination thereof.

4. The storage system of claim 1, wherein:
   the probability weight is a log likelihood ratio (LLR) weight.

5. The storage system of claim 1, wherein:
   the controller is further operable to, based on the comparisons, suspend the portion of the storage device from Input/Output operations until errors from the portion of the storage device are determined as transient.

6. A method operable with a storage device, the method comprising:
   soft reading data from a portion of the storage device, the portion being less than the entire storage device;
   decoding the soft read data a plurality of times using a plurality of probability weights;
   comparing each decoded soft read data to hard read data from the portion of the storage device;
   generating a plurality of error metrics based on the comparisons;
   establishing a read voltage for a subsequent hard read of the portion of the storage device based on the error metrics;
   tracking historical increases in the established read voltage;
   determining a lifespan of the portion of the storage device based on the historical increases in the established read voltage; and
   retiring the portion of the storage device when the established read voltage increases past a known voltage and the portion of the storage device has passed its lifespan.

7. The method of claim 6, wherein decoding comprises:
   decoding the soft read data using a low density parity check (LDPC).

8. The method of claim 6, wherein:
   the storage device is a NAND flash memory device, a magnetoresistive random-access memory device, or a combination thereof.

9. The method of claim 6, wherein:
the probability weight is a log likelihood ratio (LLR) weight.

10. The method of claim 6, further comprising:
based on the comparisons, suspending the portion of the storage device from Input/Output operations until errors from the portion of the storage device are determined as transient.

11. A non-transitory computer readable medium comprising instructions that, when executed by a controller of a storage device, direct the controller to:
soft read data from a portion of the storage device, the portion being less than the entire storage device;
decode the soft read data a plurality of times using a plurality of probability weights;
compare each decoded soft read data to hard read data from the portion of the storage device;
generate a plurality of error metrics based on the comparisons;
establishing a read voltage for a subsequent hard read of the portion of the storage device based on the error metrics;
track historical increases in the established read voltage;
determine a lifespan of the portion of the storage device based on the historical increases in the established read voltage; and
retire the portion of the storage device when the established read voltage increases past a known voltage and the portion of the storage device has passed its lifespan.

12. The computer readable medium of claim 11, further comprising instructions that direct the controller to:
decode the soft read data using a low density parity check (LDPC).

13. The computer readable medium of claim 11, wherein:
the storage device is a NAND flash memory device, a magnetoresistive random-access memory device, or a combination thereof.

14. The computer readable medium of claim 11, wherein:
the probability weight is a log likelihood ratio (LLR) weight.

15. The computer readable medium of claim 11, further comprising instructions that direct the controller to:
based on the comparisons, suspend the portion of the storage device from Input/Output operations until errors from the portion of the storage device are determined as transient.

16. The system of claim 1, wherein:
the portion of the storage device is at least one of a page of the storage device and a block of the storage device.

17. The method of claim 6, wherein:
the portion of the storage device is at least one of a page of the storage device and a block of the storage device.

18. The computer readable medium of claim 11, wherein:
the portion of the storage device is at least one of a page of the storage device and a block of the storage device.

* * * * *